United States Patent
Vu et al.

(10) Patent No.: US 12,009,628 B2
(45) Date of Patent: Jun. 11, 2024

(54) STRUCTURE AND CONFIGURATION OF THE PASSIVELY Q-SWITCHED DIODE END-PUMPED SOLID-STATE LASER

(71) Applicant: VIETTEL GROUP, Ha Noi (VN)

(72) Inventors: Van Tuan Vu, Ha Noi (VN); Trung Anh Hoang, Mai Son District (VN); Trung Hieu Le, Ha Noi (VN)

(73) Assignee: VIETTEL GROUP, Ha Noi (VN)

( * ) Notice: Subject to any disclaimer, the term of this patent is extended or adjusted under 35 U.S.C. 154(b) by 224 days.

(21) Appl. No.: 17/560,358

(22) Filed: Dec. 23, 2021

(65) Prior Publication Data

US 2022/0209491 A1    Jun. 30, 2022

(30) Foreign Application Priority Data

Dec. 24, 2020    (VN) .............................. 1-2020-07501

(51) Int. Cl.
| | |
|---|---|
| H01S 3/1115 | (2023.01) |
| H01S 3/06 | (2006.01) |
| H01S 3/094 | (2006.01) |
| H01S 3/0941 | (2006.01) |
| H01S 3/113 | (2006.01) |
| H01S 3/16 | (2006.01) |
| H01S 3/17 | (2006.01) |

(52) U.S. Cl.
CPC ...... *H01S 3/1115* (2013.01); *H01S 3/094049* (2013.01); *H01S 3/094076* (2013.01); *H01S 3/09415* (2013.01); *H01S 3/113* (2013.01); *H01S 3/1608* (2013.01); *H01S 3/1618* (2013.01); *H01S 3/17* (2013.01); *H01S 3/061* (2013.01)

(58) Field of Classification Search
CPC .. H01S 3/09415; H01S 3/1608; H01S 3/1618; H01S 3/094049; H01S 3/113; H01S 3/061

See application file for complete search history.

(56) References Cited

U.S. PATENT DOCUMENTS

| | | | | |
|---|---|---|---|---|
| 5,982,789 | A * | 11/1999 | Marshall | G02F 1/39 372/33 |
| 6,023,479 | A * | 2/2000 | Thony | H01S 3/113 372/71 |
| 9,368,933 | B1 * | 6/2016 | Nijjar | H01S 3/025 |
| 2002/0181513 | A1 * | 12/2002 | Laurell | H01S 3/0627 372/11 |
| 2004/0184505 | A1 * | 9/2004 | Trussell, Jr. | H01S 3/0627 372/75 |
| 2007/0098024 | A1 * | 5/2007 | Mitchell | H01S 3/09415 372/10 |

(Continued)

FOREIGN PATENT DOCUMENTS

DE    102019116113 A1 * 12/2020

*Primary Examiner* — Joshua King
(74) *Attorney, Agent, or Firm* — patenttm.us

(57) ABSTRACT

The passively q-switched diode end-pumped solid-state laser is used the gain medium made of Er:Yb doped crystal and the Q-switch made of $Co^{2+}:MgAl_2O_4$ crystal. The optical elements are optimally designed for the resonator to achieve pulse energy in a range 0.5 mJ≤E≤2 mJ with the pulse width in a range of 4 ns-15 ns. The resonator is appropriate to use in laser rangefinders, target designator, and other products in military and civilian applications.

5 Claims, 3 Drawing Sheets

(56) References Cited

U.S. PATENT DOCUMENTS

| | | | |
|---|---|---|---|
| 2007/0121689 A1* | 5/2007 | Brown | H01S 3/025 |
| | | | 372/39 |
| 2012/0269214 A1* | 10/2012 | Li | H01S 3/0627 |
| | | | 372/11 |
| 2013/0094525 A1* | 4/2013 | Nettleton | H01S 3/1608 |
| | | | 372/10 |
| 2016/0094006 A1* | 3/2016 | Hagita | H01S 3/106 |
| | | | 123/143 B |
| 2016/0094009 A1* | 3/2016 | Izumiya | H01S 3/1611 |
| | | | 372/6 |
| 2016/0294144 A1* | 10/2016 | Williams | H01S 3/1312 |
| 2016/0301184 A1* | 10/2016 | Williams | H01S 3/1666 |
| 2017/0201061 A1* | 7/2017 | Taira | H01S 3/113 |
| 2018/0219351 A1* | 8/2018 | Munroe | H01S 3/0405 |
| 2020/0251874 A1* | 8/2020 | Myers | H01S 3/094053 |

* cited by examiner

STRUCTURE AND CONFIGURATION OF THE PASSIVELY Q-SWITCHED DIODE END-PUMPED SOLID-STATE LASER

TECHNICAL FIELD

The present invention relates to a structure and configuration of the passively Q-switched diode end-pumped solid-state laser. This invention proposes a configuration that uses the end-pumping structure, can be applied for various military applications such as laser range-finder and target designator.

BACKGROUND

The structure of the passively q-switched diode end-pumped solid-state laser includes main components such as: laser diodes, coupling lenses, input coupler, active gain medium, q-switch and output coupler. These optical components are integrated by a precise mechanical housing to form a laser transmitter. The nanosecond pulse width is generated by using the active or passive q-switch. The pulse energy significantly depends on different parameters such as cavity length, active rod size, initial transmittance of saturable absorber and output coupler reflectivity. For the resonator cavity using an end-pump structure, it is important to optimize the pump laser beam diameter or dimensions to maximize the output peak power. In addition, the initial transmittance of the Q-switch and the reflectivity of the output coupler is also necessary to study improving the pulse energy and reduce the intracavity fluence, simultaneously. The present invention is focused on the configuration of a resonator cavity in which the mechanical, optical, and physical parameters are optimized to ensure that the cavity can achieve pulse energy in the range of 0.5 mJ to 2 mJ with the pulse width in the range of 4 ns to 15 ns.

SUMMARY

The purpose of the present invention is to propose a laser cavity configuration using an Er:Yb doped glass and $Co_{2+}$:$MgAl_2O_4$ crystal as a passive q-switch. The technical specifications of elements are optimized to achieve pulse energy (E) in the range of 0.5 mJ to 2 mJ and laser pulse width in the range of 4 ns to 15 ns.

To achieve the above purpose, the proposed structure includes the following components:

A laser base is used to mount optical elements comprising of laser diode, coupling lenses, input coupler, gain medium, Q-switch, and output coupler along the optical axis of the diode laser to form a laser transmitter.

A diode laser source is a pulsed laser source that is a type of laser diode bar with a center wavelength in the range of 900 nm to 1000 nm, which can generate laser pulses with a peak power of 20 W to 120 W, the pulse width of 2 ms to 5 ms, and the pulse repetition rate of 1 Hz to 10 Hz.

Coupling lenses are responsible for guiding the laser from the diode laser source to the active gain medium in the cavity. The position of each lens in the system can be varied axially to control the diameter/dimensions of the pump laser beam entering the active rod in the range of 0.5 mm to 1 mm.

An input coupler that is coated with an anti-reflective layer for the pump laser and highly reflective layer for the emitted radiation. The input coupler can be an individual mirror or coated directly on the end-side of the gain medium.

A intracavity holder is used to attach the gain medium and the Q-switch. This intracavity holder is precisely mounted on the laser base.

A gain medium is made of phosphate glass doped with ions $Er^{3+}$ and $Yb^{3+}$ (Er:Yb co-doped crystal). The laser with the desired wavelength will be emitted under the excitation of the pump diode laser source.

A passive Q-switch is made of $Co^{2+:MgAl}{}_2O_4$ material as a laser on/off switch can be placed perpendicularly or at Brewster's angle to the laser in the cavity.

An output coupler is coated to allow the laser to transmit partially. A part of the laser is reflected into the resonator cavity while the remaining part of the laser exits from the resonator cavity with the desired pulse energy.

DETAILED DESCRIPTION OF THE DISCLOSURE

Figure 1:
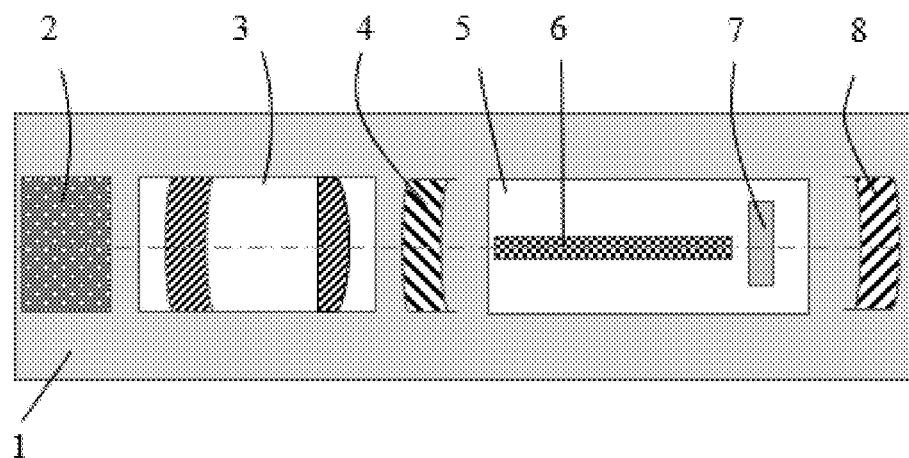
FIG. 1 is a schematic diagram showing the general structure of the passively q-switched diode-pumped solid-state laser.

FIG. 1 shows the configuration of a laser transmitter which mainly includes the laser base (1), laser diode source (2), coupling lenses (3) guiding diode laser into resonator cavity, input coupler (4), intracavity holder (5) to mount the gain medium (6) and passive Q-switch, and the output coupler (7).

The laser base (1) made of copper (Cu) is precisely machined, the mounting position between the input coupler and output coupler can be varied in a range of 15 mm-30 mm to ensure the output laser pulse width is in a range of 4 ns-15 ns.

Figure 2:
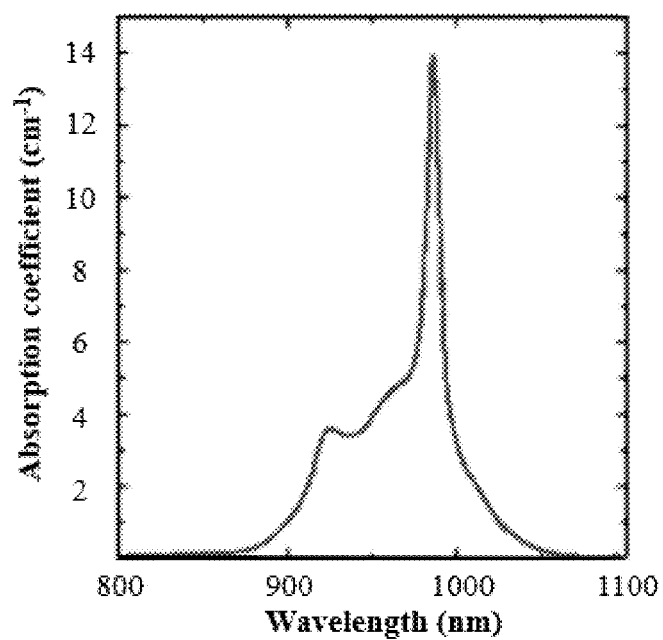
FIG. 2 is a graph showing the absorption coefficient and the emission cross-section according to wavelength.

The diode laser source (2) is mounted on the laser base (1). The center wavelength of the diode laser is in a range of 900 nm-1000 nm to match the absorption spectrum diagram of the gain medium made of Er:Yb doped glass as shown in FIG. 2. The diode laser source is a pulsed laser source that possesses pulse peak power in a range of 20 W-120 W, pulse width in a range of 2 ms-5 ms, and pulse repetition frequency in a range of 1 Hz-10 Hz. The pulse peak power in the mentioned band ensures adequate pump power for the resonator cavity to generate the laser pulse energy in a range of 0.5 mJ to 2 mJ. The pump pulse width in a range of 2 ms-5 ms is based on the gain medium material Er:Yb. The pulse emission frequency from 1 Hz to 10 Hz corresponds to the desired pulse repetition frequency of the output laser.

Figure 3:
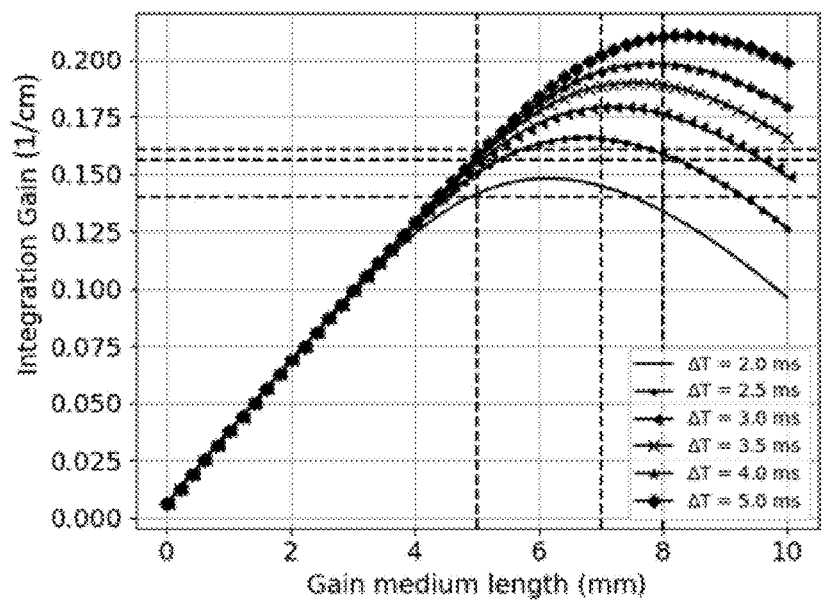
FIG. 3 is a graph showing the dependence of gain coefficient versus the rod length at different durations of the pump pulses.
Figure 4:
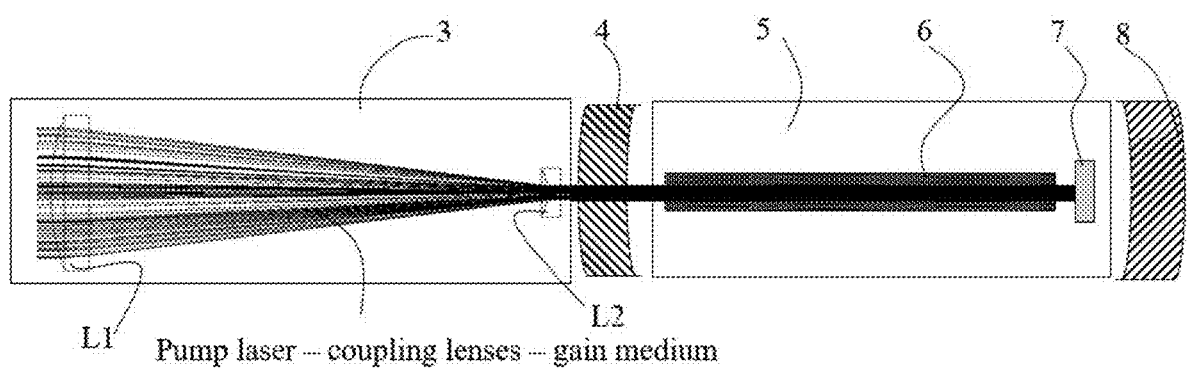
FIG. 4 is a diagram showing the laser beam from the diode laser through the coupling lenses to the gain medium.
Figure 5:
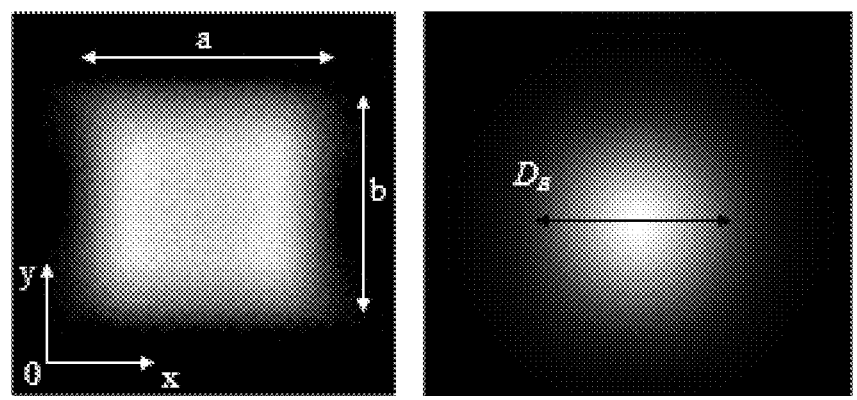
FIG. 5 is a drawing showing the simulation of the cross-section of the laser beam pumped in the gain medium.

The coupling lenses consists of spherical and cylindrical lenses (FIGS. 3 and 4), which can be adjusted along the optical axis, to ensure that the diameter ($D_B$) or dimensions (a, b) of the cross-section of the pump laser beam in the gain medium are in a range of 0.5 mm-1 mm. $L_1$ and $L_2$ are two cylindrical lenses used to reduce the beam divergence of the pump beam horizontally and vertically, respectively (FIG. 4).

Gain medium (6) is made of Er:Yb doped glass which is doped from $0.3 \times 10^{20}$ to $0.5 \times 10^{20}$ cm$^{-3}$ Er$^{3+}$ ions and from $1.7 \times 10^{21}$ to $2 \times 10^{21}$ cm$^{-3}$ Yb$^{3+}$ ions. Yb$^{3+}$ ion concentration in the above range are used to optimize the energy transfer efficiency from Yb$^{3+}$ ions to Er$^{3+}$ ions during pumping. Er$^{3+}$ ion concentration from $0.3 \times 10^{20}$ to $0.5 \times 10^{20}$ cm$^{-3}$ is used to obtain the maximum value of gain in the cavity and reduce the reabsorbing photon emitted in cavity.

The gain medium length is optimally calculated for the resonator cavity operating in free-run mode:

$$\frac{\partial N_{Yb}}{\partial t} = W_p(x, y, z, t) - \frac{N_{Yb}}{\tau_{Yb}} - \alpha_{ET} N_{Yb}(N_{Er}^0 - N_{Er}) \quad (1)$$

$$\frac{\Delta N_{Er}}{\Delta t} = \alpha_{ET} N_{Yb}(N_{ER}^0 - N_{ER}) - \frac{N_{Er}}{\tau_{Er}} \quad (2)$$

where $N_{Yb}$ and $N_{Er}$ respectively are population density of Yb$^{3+}$ at energy level $^2F_{5/2}$ and Er$^{3+}$ at energy level $^4I_{13/2}$; $N^0_{Er}$ is doping concentration of Er$^{3+}$ ions; $\tau_{Er}$ and $\tau_{Yb}$ are the lifetime of Er$^{3+}$ and Yb$^{3+}$ ions at energy level mention above, respectively; $W_p$ (x, y, z, t) is the rate of laser pump source; $\alpha_{ET}$ is energy transfer coefficient between Yb$^{3+}$ and Er$^{3+}$. Gain g(x, y, z, t) in gain medium with the length of z can be expressed by:

$$g(x,y,z,t) = \int_0^z k_g(x,y,z',t)dz' \quad (3)$$

$$k_g = N_{Er}\sigma_{SE}^L - (N_{Er}^0 - N_{Er})\sigma_{abs}^L \quad (4)$$

where $\sigma_{SE}^L$ and $\sigma_{abs}^L$ are emission and absorption cross-section of Er$^{3+}$ at laser wavelength $\nu_L$. FIG. 3 shows one round-trip gain as a function of gain medium length with different pump pulse-widths. Optimally, gain medium length ranges from 5 mm to 8 mm while pump pulse width ranges from 2 ms to 5 ms.

Input coupler (4) is coated with the anti-reflective layer for the wavelength between 900 nm and 1000 nm to transmit ≥98% and highly reflective for the wavelength between 1525 nm and 1570 nm to reflect >98%. This element can be an individual mirror or a coating layer on the end-side of the gain medium (6).

Passive Q-switch (7) is a saturable absorber made of Co$^+$:MgAl$_2$O$_4$ crystal with initial transmittance (T$_0$) in the range 85%≤T$_0$≤92%, which ensures laser pulse energy ≥0.5 mJ.

Intracavity holder (5) attaches gain medium (6) and Q-switch (7). Q-switch (7) is placed perpendicularly or at Brewster's angle to the optical line. This element can be placed separately or bonded directly on the right side of the gain medium (6). The optical line is defined as the line perpendicular to the input (4) and the output coupler (8) which simultaneously is the symmetry axis of the gain medium (6). The intracavity holder (5) is precisely mounted on the laser base (1).

Output coupler (8) is coated to allow the radiation to reflect ≤85% with the wavelength between 1525 nm and 1570 nm, hence, the intracavity fluence in the cavity is <10 J/cm$^2$ (damage threshold of the optical elements used). The intracavity fluence (F$_{in}$) is expressed by:

$$F_{in} = \frac{2 - T_{OC}}{T_{OC}} \frac{2E}{S_{SA}} < 10 \text{ J/cm}^2 \quad (5)$$

where $T_{OC}$ is the transmittance of output coupler, E is pulse energy output from the laser system.

Although the structure of the resonator cavity in the present invention has been illustrated in the accompanying Drawings and described in the foregoing Detailed Description, it should be noted that the invention is not limited to the described resonator cavity, but is capable of different rearrangements, modifications or substitutions without departing from the invention as set forth and defined by the following claims.

What is claimed is:

1. A configuration of a passively q-switched diode end-pumped solid-state laser, comprising:
   a laser base attaching optical elements along an optical axis of a diode laser source to form a laser transmitter;
   the diode laser source is a pulsed laser source configured to generate a pump laser beam with a center wavelength in a range of 900 nm-1000 nm, which can generate pulsed laser with a peak power in a range of 20 W-120 W, a pulse width in a range of 2 ms-5 ms, and a pulse repetition frequency in a range of 1 Hz-10 Hz;
   coupling lenses which are responsible for guiding the pump laser beam from the diode laser source into a gain medium in a resonator cavity, positions of the coupling lenses are varied axially to control a diameter, D$_B$, or cross-section dimensions, a, b, of the pump laser beam entering the gain medium in a range of 0.5 mm-1 mm;
   the resonator cavity comprising, an input coupler which has an anti-reflective coating for the pump laser beam and a highly reflective coating for radiations emitted in the resonator cavity, which possess a desired laser emitted by the gain medium, wherein the input coupler comprises an individual coupler or a coating directly on an end-side of the gain medium;
   an intracavity holder attaching the gain medium and a Q-switch, wherein the intracavity holder is precisely mounted on the laser base, the Q-switch is placed perpendicularly or at a Brewster's angle to an optical line, wherein the Q-switch is placed separately or coated directly on another side of the gain medium that is opposite to the input coupler, the optical line is defined as a line perpendicular to the input coupler and output coupler which simultaneously is a symmetry axis of the gain medium;
   the gain medium is made of a lass doped with ions Er$^{3+}$ and Yb$^{3+}$, wherein a laser beam with the desired wavelength will be emitted under the excitation by the pump laser beam,
   the Q-switch comprises a passive Q-switch is made of Co$^{2+}$:MgAl$_2$O$_4$ crystal as a laser on/off switch and is placed perpendicularly or at Brewster's angle to the optical line in the resonator cavity,
   the output coupler is coated to allow the laser beam to transmit partially, a part of the laser beam is reflected into the resonator cavity while a remaining part of the laser beam exits from the resonator cavity with a desired pulse energy.

2. The configuration of claim 1, wherein the gain medium is made of Er:Yb doped glass with an Er concentration in a range of $0.3 \times 10^{20}$ to $0.5 \times 10^{20}$ cm$^{-3}$, a Yb concentration in a range of $1.7 \times 10^{21}$ to $2 \times 10^{21}$ cm$^{-3}$, a gain medium radius R$_{Er:Yb}$ of 0.5 mm≤R$_{Er:Yb}$≤1, mm and a gain medium length L$_{Er:Yb}$, of 5 mm≤L$_{Er:Yb}$≤8 mm.

3. The configuration of claim 1, wherein the end pumped laser transmitter has a mechanical length between the input coupler and the output coupler of 15 mm≤L$_{KD}$≤30 mm.

4. The configuration of claim 1, wherein the Q-switch is made of Co$^{2+}$:MgAl$_2$O$_4$ crystal with an initial transmittance, $T_0$, of 85%≤$T_0$≤92% and a reflectivity of output coupler ≤85% at wavelength 1525 nm-1570 nm.

5. The configuration of claim 1, with the coupling lenses that can adjust positions of an individual lens to change the diameter $D_B$, or cross-section dimensions, a, b, of the pump laser beam from laser diode source in the range: 0.5 mm≤$D_B$, a, b≤1 mm.

\* \* \* \* \*